United States Patent
Ito et al.

(10) Patent No.: US 6,302,957 B1
(45) Date of Patent: Oct. 16, 2001

(54) QUARTZ CRUCIBLE REPRODUCING METHOD

(75) Inventors: Makoto Ito; Hiroki Murakami, both of Saga (JP)

(73) Assignee: Sumitomo Metal Industries, Ltd., Osaka (JP)

(*) Notice: Subject to any disclaimer, the term of this patent is extended or adjusted under 35 U.S.C. 154(b) by 0 days.

(21) Appl. No.: 09/670,715

(22) Filed: Sep. 28, 2000

(30) Foreign Application Priority Data

Oct. 5, 1999 (JP) .................................................. 11-284341
Jun. 30, 2000 (JP) .................................................. 12-199448

(51) Int. Cl.$^7$ .................................................. C30B 15/00
(52) U.S. Cl. ........................... 117/13; 65/3.2; 65/DIG. 8; 117/200; 117/900
(58) Field of Search .................... 65/3.2, DIG. 8; 117/13, 200, 900

(56) References Cited

U.S. PATENT DOCUMENTS 5,980,629 * 11/1999 Hansen et al. ............................ 117/13
6,106,610 * 8/2000 Watanabe et al. ....................... 117/13

* cited by examiner

*Primary Examiner*—Felisa Hiteshew
(74) *Attorney, Agent, or Firm*—Morrison & Foerster, LLP

(57) ABSTRACT

An inner surface of a quartz crucible after being used is cleaned by an acid liquid, and an extraneous material adhered to its inner surface is removed. The inner surface after the extraneous material has been removed is heat treated at 1600° C. or more, and the inner surface where cristobalite formation occurs is recovered into an amorphous state. In this manner, the quartz crucible after being used for growing single crystal silicon is reproduced to a level equal to a new crucible.

10 Claims, 1 Drawing Sheet

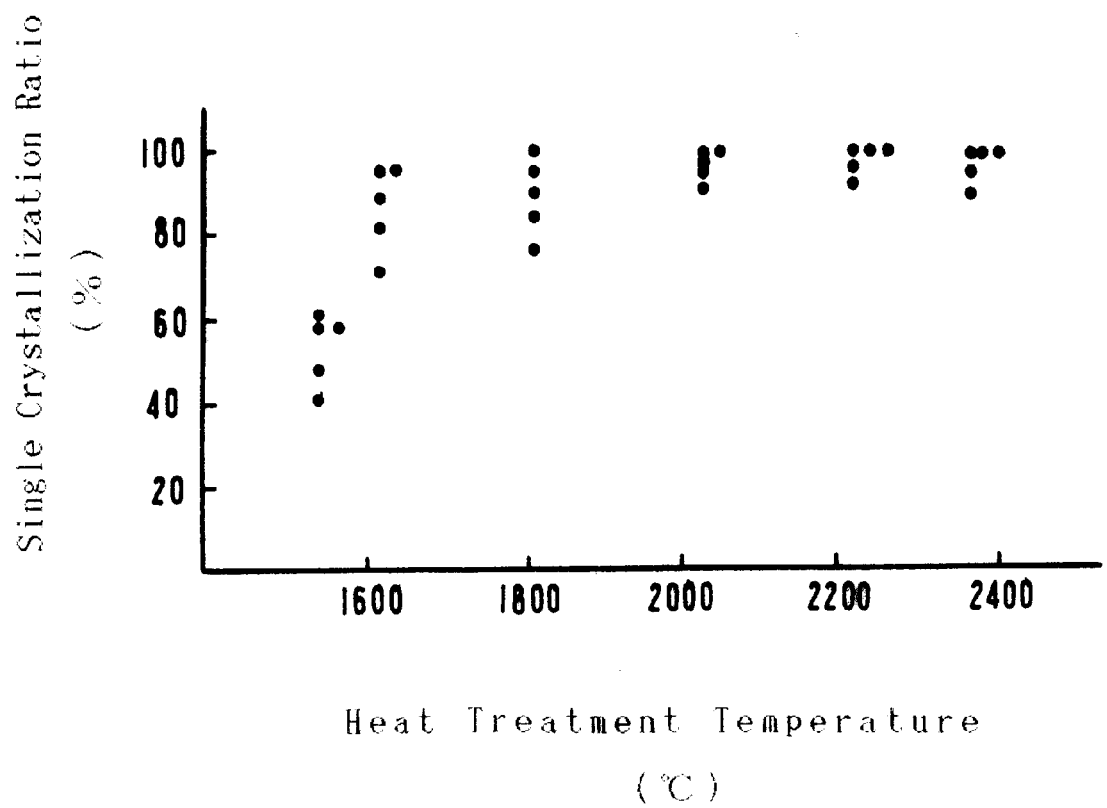

QUARTZ CRUCIBLE REPRODUCING METHOD

BACKGROUND OF THE INVENTION

1. Field of the Invention

The present invention relates to a quartz crucible reproducing method for reusing a quartz crucible after being used for producing single crystal silicon by the Czochralski (CZ) method.

2. Description of the Prior Art

In producing a high purity single crystal silicon for a semiconductor by the CZ method, a quartz glass based crucible is essential to maintain silicon melt during a single crystal producing. The reason is as follows. In order to maintain silicon with a high activity at a high temperature in a molten state, it is required to maintain a container shape even at around 1450° C. The quartz glass based crucible has a variety of advantageous characteristics, i.e., high heat resistance characteristics, high purity characteristics in which impurities are controlled at a level of ppm, and further, possession as a constituent element of oxygen that can be efficiently utilized even if it is dissolved in a silicon melt.

However, a high purity quartz crucible used for producing single crystal silicon by the CZ method is very expensive. Thus, the rate of the crucible cost in the manufacturing cost of single crystal silicon is large, which becomes a large obstacle in reducing the manufacturing cost.

A repeated use of the quartz crucibles is the most efficient to reduce the crucible cost. However, as it will be described later, crucible reusing technique has not been established yet. Therefore, there is proposed a continuous CZ method in which, while a crystal producing is carried out, a silicon raw material is additionally supplied, thereby increasing a crystal producing quantity per batch or a multiplying technique in which, after crystal producing has been completed, a silicon raw material is supplied to a residual silicon melt contained in the crucible, thereby repeating crystal producing.

However, in these techniques, there is a problem that, since crystal producing per batch takes more time, probability of causing dislocation is increased during this period, thus making it difficult to cause dislocation free producing. This problem has not been essentially solved.

BRIEF SUMMARY OF THE INVENTION

OBJECT OF THE INVENTION

In the meantime, an attempt to reuse a quartz crucible is described in Japanese Utility Model Publication No. 48-41319. In this publication, there is proposed a specific method for, after using a quartz crucible, removing the inner quartz crucible from an outer support crucible.

In producing a single crystal silicon using the CZ method, however, a part of silicon melt remains in the quartz crucible after the producing has been completed, the residual melt coagulates, and the temperature is lowered. In this process, there is an essential problem that a quartz crucible cracks due to a difference in a thermal expansion coefficient between silicon and quartz, and the crucible cannot be reused after a crystal producing for a batch.

In addition, even if the residual melt in the crucible is removed and the quartz crucible can be removed from the outer support crucible without causing cracks, the crucible in producing is softened and deformed or dislocation free ratio is very low in the second use or later. Thus, actual reuse is impossible at a present stage.

It is an object of the present invention to provide a quartz crucible reproducing method capable of repairing a quartz crucible after being used up to a level at which crystal producing substantially equal to a new crucible is possible.

SUMMARY OF THE INVENTION

In the case where a quartz crucible after being used is reused, a low dislocation free ratio is problematic in particular. According to the present inventor's investigation, a single crystallization ratio is merely 30% when a quartz crucible after being used is reused without any treatment. Alternatively, a single crystallization ratio exceeds 90% when a new quartz crucible is used. A single crystallization ratio is obtained by the equation below.

(Dislocation free crystal length)/(cylindrical crystal length)×100

From such circumstances, the present inventor made a variety of discussions as to the causes of, and countermeasure against, the low dislocation free ratio which inhibits reuse of the quartz crucible. As a result, the following fact is clarified.

In the quartz crucible after being used, even if the residual melt is removed, the extraneous material such as silicon adheres to the inner surface of the crucible. In addition, grain shaped extraneous material such as silicon mono-oxide or silicon dioxide adheres thereto. These extraneous materials must be removed in order to reuse the quartz crucible, but dislocation free ratio is not remarkably improved by removing the extraneous material. This is because the inner surface of the crucible is eroded by crystallization called cristobalite formation and its inside is stripped out during reuse. This erosion is called devitrification. As a result of cristobalite formation, the inside is brittle as if the powder were blowing, silicon adheres to a deep erosion portion, and dislocation frequently occurs during reuse.

Therefore, for reuse of the quartz crucible, it is indispensable to carry out the repair of the inner surface where cristobalite formation occurs as well as removal of the extraneous material adhering to the inner surface of the crucible. Alternatively, a new quartz crucible consists of amorphous silicon dioxide.

As a result of further investigation, it was found that chemical etching treatment such as acid wash treatment or gas etching treatment can be effectively employed as treatment for removing extraneous materials adhering to the inner surface of the crucible; non-crystallization of the inner surface using high temperature heat treatment can be effectively employed as treatment for repairing the inside where cristobalite formation occurs; and the quartz crucible after being used can be repaired to performance substantially equal to that of a new crucible by using composite treatment in which these treatments are combined with each other.

In addition, according to chemical etching treatment or mechanical grinding treatment, the extraneous material adhering to the inner surface of the crucible is removed; an inside layer portion where cristobalite formation occurs is removed; a non-crystal quartz appears in the inner surface of the crucible, and its inner surface is non-crystallized. Therefore, chemical etching treatment or mechanical grinding treatment can be effectively employed as treatment for repairing the inner surface where cristobalite formation occurs.

The quartz crucible reproducing method according to the present invention has been developed based on these findings. In this method, a quartz crucible is reproduced by carrying out the repair treatment for the inner surface employing at least one of the chemical etching treatment, mechanical grinding treatment, and high temperature heat treatment for the inner surface of the quartz crucible after being used for producing the single crystal silicon by the CZ method.

By using at least one of the chemical etching treatment, mechanical grinding treatment, and high temperature heat treatment, the inner surface of the quartz crucible after being used is non-crystallized, thereby making it possible to repair the crucible up to a level at which crystal producing substantially equal to a new crucible is possible.

The non-crystallization ratio on the inner surface of the crucible is preferably 70% or more. If the non-crystallization ratio is less than 70%, the single crystallization ratio in reuse is not remarkably improved.

There is provided an advantageous effect that high temperature heat treatment not only makes the inner surface of the crucible inside non-crystalline, but also lowers the infrared ray transmittance on the bottom portion of the crucible and inhibits dislocation at the time of reuse, in particular, at the latter period of pull-up.

That is, the quartz crucible is made of a transparent layer whose inside layer is free of air bubbles in order to prevent dislocation of a single crystal. On the other hand, the outside layer is made of a non-transparent layer in which air bubbles are dispersed by promoting heat dispersion to carry out uniform heating. The thickness of the transparent layer is 0.5 to 3 mm. If acid wash or the like is carried out when a quartz crucible is reproduced, the surface of the crucible is smoothened, and the infrared ray transmittance of the crucible bottom portion increases. High temperature treatment for the inner surface of the crucible is effectively employed to grow the air bubbles in the non-transparent layer, lower the infrared ray transmittance on the bottom portion of the crucible, and improve the single crystallization ratio during reuse.

Cristobalite treatment is limited to the surface layer portion of the transparent layer. Thus, chemical etching treatment or mechanical grinding treatment for making the inner surcace non-crystalline may be carried out within the range of the thickness of the transparent layer, whereby this transparent layer can be left after the treatment.

It is particularly preferable that a combination of chemical etching treatment and high temperature heat treatment is used as the repair treatment for the inner surface from the viewpoint of workability, advantageous effect, and being free of such a risk that the transparent layer is removed. Chemical etching treatment can include acid cleaning treatment or gas etching treatment.

In the acid cleaning treatment, the extraneous material adhering to the inner surface of the crucible is primarily removed. This treatment can be carried out by using a combination of cleaning using a first acid solution capable of dissolving silicon mono-oxide or silicon dioxide and cleaning using a second acid solution capable of dissolving silicon. In addition, the treatment can also be carried out by only cleaning using the second acid solution. When these treatments are compared, using the former provides a higher dislocation free ratio during reuse and is preferable.

Hydrofluoric acid (HF), for example, is properly employed as a first acid solution. A mixture of hydrofluoric acid (HF) and nitric acid ($HNO_3$), for example, is properly employed as a second acid solution. If the treatment time is extremely short, the extraneous material is not sufficiently removed. If the treatment time is extremely long, the roughness on the inner surface of the crucible occurs. The treatment time is properly selected according to the type or temperature of the treatment solution. In the case of hydrofluoric acid or a mixture of hydrofluoric acid and nitric acid, the treatment time is properly 5 to 30 minutes. It is verified that no problem occurs when the solution temperature is ordinary temperature.

In the gas etching treatment, as in the acid cleaning treatment, the extraneous material adhering to the inner surface of the crucible is primarily removed. This treatment can be carried out by chlorine based gas capable of dissolving silicon. Hydrogen chloride (HCl) gas or chlorine ($Cl_2$) gas is preferably employed as a chloride based gas.

High temperature heat treatment primarily undergoes repair of the inner surface where cristobalite formation occurs. In addition, form processing including modification of softening and deformation during prior use can be carried out in combination. Further, the infrared ray transmittance on the bottom portion of the crucible is lowered. This treatment can be performed by oxyhydrogen flame or arc electric discharge, for example.

The treatment temperature for the inner surface of the crucible during high temperature heat treatment is preferably 1600 to 2400° C. When the temperature is less than 1600° C., there is a danger that repair of cristobalite becomes insufficient, and softening becomes insufficient, thus making it difficult to perform form processing of the crucible. If the temperature exceeds 2400° C., the softening and deformation becomes remarkable, thus making it difficult to perform form processing.

Technique for removing the extraneous material adhering to the inner surface of the quartz crucible is described in Japanese Patent Publication No. 6-53634. The extraneous material described therein adheres to the inner surface of a new crucible. That is, according to the technique described in Japanese Patent Publication No. 6-53634, a faulty new crucible is reproduced, and cristobalite formation does not occur on the inner surface of the new crucible. Thus, this technique is essentially different from the method for reproducing the crucible after being used, according to the present invention.

BRIEF DESCRIPTION OF THE DRAWINGS

FIG. 1 is a graph depicting a relationship between a heat treatment temperature and a single crystallization ratio.

DETAILED DESCRIPTION OF THE PREFERRED EMBODIMENTS

Hereinafter, preferred embodiments of the present invention will be described by way of examples.

In the first step, the residual silicon melt is removed from a quartz crucible after being used for producing single crystal silicon by using the CZ method. Thereafter, the quartz crucible is cooled and is removed from the outer support crucible.

In the second step, the quartz crucible removed from the outer support crucible is immersed in hydrofluoric acid that is a first acid solution, and its inner surface is subjected to first cleaning treatment with the solution. Subsequently, the quartz crucible is immersed in a mixture of hydrofluoric acid and nitric acid, which is a second acid solution, and its inner surface is subjected to secondary cleaning treatment using the mixture solution. By these cleaning treatments, the silicon adhering to the inner surface of the quartz crucible or grain shaped extraneous material such as silicon mono oxide or silicon dioxide is removed. First cleaning treatment can be eliminated. After the cleaning treatments have been completed, the quartz crucible is cleaned with water, and is dried.

In the third step, the inner surface of the quartz crucible that has been cleaned with water and dried is heat treated by using oxyhydrogen flame of 1600° C. or more. In this manner, cristobalite and the inner surface of the quartz crucible roughened when that portion has been released therefrom are non-crystallized, and is repaired to the surface properties equal to the inner surface of original quartz crucible.

The thus reproduced quartz crucible is combined with the outer support crucible, and is used for producing single crystal silicon by using the CZ method again. Reproducing treatment is carried out every reuse, thereby making it possible to reuse the crucible several times.

In the second step, it is possible to carry out gas etching treatment using hydrogen chloride gas or chlorine gas in place of acid cleaning treatment. In addition, it is possible to carry out mechanical grinding treatment in place of these chemical etching treatments. In the third step, i.e., at the time of heat treatment, arc electric discharge can be used in place of oxyhydrogen flame. In the second step, when the surface portion of the inner surface of crucible is well removed, merely whereby the non-crystallization ratio can be improved to a predetermined level, the third process, heat treatment can be eliminated.

EXAMPLES

Now, the results of comparative tests carried out to clarify the effectiveness of the present invention will be described.

Comparative Test 1

Poly-silicon of 60 kg was charged and melted in a 18-inch natural quartz crucible, and then, a 6-inch single crystal was produced from the melt. After the crystal has been removed, the residual silicon was removed while in a molten state. After cooling, recollected 10 quartz crucibles were prepared. 5 of the recollected 10 crucibles were reused as they were. The residual 5 crucibles were immersed in hydrofluoric acid for 20 minutes, and were subjected to reuse after cleaning with water and dried. During reuse, as in the first use, poly-silicon of 60 kg was charged, and a single crystal was produced. As a reference example, a new natural quartz crucible was used, poly-silicon of 60 kg was charged, and a single crystal was produced. The single crystallization ratio during each reuse is shown in Table 1.

The single crystallization ratio during reuse rises due to the cleaning with hydrofluoric acid, and the dislocation free ratio is improved.

TABLE 1

| Acid cleaning | Single crystallization ratio |
| --- | --- |
| None | 34% (n = 5) |
| HF solution | 52% (n = 5) |
| Reference example | 92% (n = 5) |

Comparative Test 2

Five of the 20 quarts crucibles recollected in the same way as that in Comparative Test 1 were subjected to inner surface heat treatment with oxyhydrogen flame while no cleaning is performed. Five of the remaining 15 crucibles were subjected to inner surface heat treatment after being immersed in hydrofluoric acid for 20 minutes. The remaining 5 crucibles were immersed in a mixture of hydrofluoric acid and nitric acid for 20 minutes after being immersed in hydrofluoric acid for 20 minutes. Thereafter, the immersed crucibles were subjected to inner surface heat treatment with oxyhydrogen flame. The treatment temperature during heat treatment was about 2200° C. After heat treatment, poly-silicon of 60 kg was charged, and single crystal silicon was produced. As a reference example, a new crucible was used. The single crystallization ratio during each reuse is shown in Table 2.

In the heat treatment alone as well, as in case of cleaning treatment alone, there is provided an advantageous effect in improvement of dislocation free ratio during reuse. By combining these treatments, the dislocation free ratio during reuse is significantly improved. In particular, in the case where a mixture of hydrofluoric acid and nitric acid is used during the cleaning treatment, the performance comparable to that of a new crucible can be obtained.

In the case where no cleaning treatment was carried out and in the case where hydrofluoric acid was used for a cleaning liquid, some crucibles cracked during the heat treatment, thus making it impossible to reuse them. This is considered to be because the silicon hardly removed by hydrofluoric acid was melted during the heat treatment, and was damaged due to a difference in thermal expansion from the quartz crucible during solidification (during volume expansion). In addition, in the case where no cleaning treatment was carried out, it was observed that devitrification occurred with the inner surface of crucible after pulling-up had been completed. This is considered to be because contamination with alkali or alkali earth elements occurred due to manual handling work while the quartz crucible after being pulled up was handled.

TABLE 2

| Acid cleaning | High temperature heating | Single crystallization ratio | Remarks |
| --- | --- | --- | --- |
| None | Done | 62% (n = 4) | Devitrification occurred with the surface of one cracked crucible after heating. |
| HF cleaning | Done | 88% (n = 3) | Two crucibles cracked after heating. |
| HF.HNO$_3$ cleaning | Done | 91% (n = 5) | |
| HF cleaning + HF.HNO$_3$ cleaning | Done | 95% (n = 5) | |
| Reference example | | 94% (n = 5) | |

Comparative Test 3

All of the 25 quartz crucibles recollected in the same way as that in Comparative Test 1 were immersed in hydrofluoric acid for 20 minutes. Thereafter, the thus immersed crucibles were immersed in a mixture of hydrofluoric acid and nitric acid, and then, were subjected to the heat treatment to the inner surface with oxyhydrogen flame. In the heat treatment, the gas flow rates of oxygen and hydrogen were changed, and the treatment temperature was changed. After the heat treatment, poly-silicon of 60 kg was charged, and single crystal silicon was produced. The single crystallization ratio during each reuse is shown in FIG. 1.

In the case where the treatment temperature during the heat treatment was less than 1600° C., the inner surface of the cristobalite quartz crucible was insufficiently repaired, and the single crystallization ration was significantly lowered. At 1600° C. or more, the dislocation free ratio during reuse was improved more remarkably with an increase in the treatment temperature.

Comparative Test 4

Poly-silicon of 60 kg was charged in a 18-inch synthetic crucible in which 1 to 3 mm of the inner surface was made of synthetic quartz, and the outside layer is made of natural quartz, and was melted. Thereafter, a 6-inch single crystal was produced from the melt. After the crystal was removed, the residual silicon was removed while in a molten state, and was cooled. Thereafter, recollected 5 synthetic crucibles were prepared. After all of the 5 synthetic crucibles were immersed in hydrofluoric acid for 20 minutes, the thus immersed crucibles were immersed in a mixture of hydrofluoric acid and nitric acid for 20 minutes, and were subjected to the heat treatment to the inner surface with oxyhydrogen flame. The treatment temperature during the heat treatment was about 2200° C. After the heat treatment, poly-silicon of 60 kg was charged, and single crystal silicon was produced. As a reference example, a new synthetic crucible was used. The single crystallization ratio during each reuse is shown in Table 3.

A crucible reproducing method in which acid cleaning treatment and high temperature heat treatment are combined with each other is effective for a synthetic quartz crucible as well as natural quartz crucible.

TABLE 3

| Crucible type | Single crystallization ratio |
| --- | --- |
| Reproduced synthetic crucible | 98% (n = 5) |
| New synthetic crucible | 100% (n = 5) |

Comparative Test 5

Five of 10 natural quartz crucibles recollected in the same way as that in Comparative Test 1 were retained in an etching chamber maintained at 1200° C.; hydrogen chloride gas was supplied thereto; the inner and outer surface were subjected to gas etching treatment, and the inner surface was heat treated by oxyhydrogen flame. The temperature during this heat treatment was about 2200° C. The residual 5 crucibles were subjected to gas etching treatment with chlorine gas in the chamber under the same conditions, and then, were subjected to the heat treatment to the inner surface with oxyhydrogen flame. After the heat treatment, poly-silicon of 60 kg was charged, and single crystal silicon was produced. As a reference example, a new crucible was used. The single crystallization ratio during each reuse is shown in Table 4.

TABLE 4

| Crucible type | Single crystallization ratio |
| --- | --- |
| Quartz crucible reproduced by HCl gas | 95% (n = 5) |
| Quarts crucible reproduced by $Cl_2$ gas | 94% (n = 5) |
| New quartz crucible | 100% (n = 5) |

A crucible reproducing method in which gas etching treatment and high temperature heat treatment are combined with each other is effective to repair and reuse of the quartz crucible as in the crucible reproducing method in which acid cleaning treatment and high temperature heat treatment are combined with each other.

In each comparative test, non-crystallization of the reproduced crucibles served for reuse was investigated. For the non-crystallization ratio, 100 samples were selected from a region coming into contact with the silicon melt on the inner surface of quarts crucible. Then, the diffraction image was investigated by X-rays with respect to the 100 samples taken from a portion of the 5-micron surface layer of each part, and simply evaluated based on the number of samples free from a peak indicative of a crystal phase. It was verified that this non-crystallization ratio was 70% or more, and the single crystallization ratio in reuse was 90% or more.

In addition, the infrared ray transmittance of the bottom portion of the reproduced crucible served for reuse was investigated. In this investigation, when an infrared ray of 0.67 to 4.5 microns in wavelength was transmitted from the inner surface of the crucible to the outer surface, the intensity ratio of the transmission light to incident light was measured. It was verified that the infrared ray transmittance of the crucible bottom portion was lowered from about 50% to 30% by high temperature heat treatment.

As has been described above, according to the quartz crucible reproducing method of the present invention, the quartz crucible after being used can be repaired to a level at which its reuse is possible, and can be repaired to a level at which producing the crystal equal to that of a new crucible is possible. This makes it possible to repeatedly use a quartz crucible for producing of single crystal in which only one batch has been conventionally used. The rate of the crucible cost in the producing of single crystal cost is significantly reduced, thereby making it possible to significantly reduce the producing cost.

What is claimed is:

1. A quartz crucible reproducing method wherein internal repair treatment using at least one of chemical etching treatment, mechanical grinding treatment, and high temperature heat treatment is carried out for an inner surface of a quartz crucible after being used for producing single crystal silicon with a CZ method, thereby reproducing said quartz crucible.

2. The quartz crucible reproducing method as claimed in claim 1, wherein a non-crystallization ratio of said inner surface of quartz crucible is set to 70% or more by said internal repair treatment.

3. The quartz crucible reproducing method as claimed in claim 1, wherein said internal repair treatment is a combination of chemical etching treatment and high temperature heat treatment.

4. The quartz crucible reproducing method as claimed in claim 1, wherein said chemical etching treatment is acid cleaning treatment or gas etching treatment.

5. The quartz crucible reproducing method as claimed in claim 4, wherein said acid cleaning treatment is crucible internal treatment using a combination of cleaning with a first acid liquid capable of dissolving silicon mono-oxide and silicon dioxide and melting with a second acid liquid capable of dissolving silicon, or crucible internal treatment consisting of cleaning with the second acid liquid.

6. The quartz crucible reproducing method as claimed in claim 5, wherein the first acid liquid hydrofluoric acid and the second acid liquid is a mixture of hydrofluoric acid and nitric acid.

7. The quartz crucible reproducing method as claimed in claim 4, wherein said gas etching treatment is crucible internal treatment with a gaseous chlorine capable of etching silicon.

8. The quartz crucible reproducing method as claimed in claim 1, wherein said high temperature heat treatment is crucible internal treatment with oxyhydrogen flame or arc discharge.

9. The quartz crucible reproducing method as claimed in claim 1, wherein the crucible internal treatment temperature in said high temperature heat treatment is set to 1600° C. or more.

10. The quartz crucible reproducing method as claimed in claim 1, wherein an infrared ray transmittance of a quartz crucible bottom portion is set to less than 30% by said high temperature heat treatment.

\* \* \* \* \*